United States Patent
Lin et al.

(10) Patent No.: US 9,023,693 B1
(45) Date of Patent: May 5, 2015

(54) MULTI-MODE THIN FILM DEPOSITION APPARATUS AND METHOD OF DEPOSITING A THIN FILM

(71) Applicant: Industrial Technology Research Institute, Hsinchu (TW)

(72) Inventors: Kung-Liang Lin, Hsinchu (TW);
Chien-Chih Chen, Taichung (TW);
Fu-Ching Tung, Hsinchu (TW);
Chih-Yung Chen, Hsinchu (TW);
Shih-Chin Lin, New Taipei (TW);
Kuan-Yu Lin, Changhua County (TW);
Chia-Hao Chang, Nantou County (TW);
Shieh-Sien Wu, Chiayi County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/138,147

(22) Filed: Dec. 23, 2013

(30) Foreign Application Priority Data

Nov. 27, 2013 (TW) .............................. 102143232 A

(51) Int. Cl.
*H01L 21/00* (2006.01)
*H01L 21/84* (2006.01)
(Continued)

(52) U.S. Cl.
CPC .......... *H01L 51/5253* (2013.01); *C23C 16/455* (2013.01); *H01L 21/02271* (2013.01); *H01L 21/02274* (2013.01); *C23C 16/4583* (2013.01); *C23C 16/45548* (2013.01); *C23C 16/505* (2013.01)

(58) Field of Classification Search
USPC ................. 438/149, 485, 513, 782, 788, 798; 257/E21.008, E21.143, E21.218, 257/E21.328
See application file for complete search history.

(56) References Cited

U.S. PATENT DOCUMENTS 8,298,370 B2 10/2012 Byun
2006/0137608 A1 6/2006 Choi et al.
(Continued)

FOREIGN PATENT DOCUMENTS

CN 102420272 4/2012
TW 540093 7/2003
(Continued)

OTHER PUBLICATIONS

Park et al., "Ultra Thin Film Encapsulation of Organic Light Emitting Diode on a Plastic Substrate," ETRI Journal, Oct. 2005, pp. 545-550, vol. 27, No. 5.
(Continued)

*Primary Examiner* — Mohsen Ahmadi
(74) *Attorney, Agent, or Firm* — Jianq Chyun IP Office

(57) ABSTRACT

A multi-mode thin film deposition apparatus including a reaction chamber, a carrying seat, a showerhead, an inert gas supplying source, a first gas inflow system and a second gas inflow system is provided. The carrying seat is disposed in the reaction chamber. The showerhead has a gas mixing room and gas holes disposed at a side of the gas mixing room. The gas mixing room is connected to the reaction chamber through the plurality of gas holes which faces the carrying seat. The first gas inflow system is connected to the reaction chamber and supplies a first process gas during a first thin film deposition process mode. The inert gas supplying source is connected to the gas mixing room for supplying an inert gas. The second gas inflow system is connected to the gas mixing room to supply a second process gas during a second thin film deposition process mode.

17 Claims, 2 Drawing Sheets

(51) Int. Cl.
*H01L 21/31* (2006.01)
*H01L 21/469* (2006.01)
*H01L 51/52* (2006.01)
*C23C 16/455* (2006.01)
*H01L 21/02* (2006.01)
*C23C 16/458* (2006.01)
*C23C 16/505* (2006.01)

(56) References Cited

U.S. PATENT DOCUMENTS

| | | | | |
|---|---|---|---|---|
| 2006/0266289 | A1* | 11/2006 | Verghese et al. | 118/715 |
| 2007/0128861 | A1 | 6/2007 | Kim et al. | |
| 2009/0178616 | A1 | 7/2009 | Byun | |
| 2009/0266911 | A1 | 10/2009 | Kim et al. | |
| 2010/0087028 | A1 | 4/2010 | Porthouse et al. | |
| 2011/0135842 | A1 | 6/2011 | Faguet et al. | |
| 2012/0160173 | A1 | 6/2012 | Endo et al. | |
| 2012/0240627 | A1* | 9/2012 | Nelson et al. | 65/32.4 |
| 2013/0171757 | A1 | 7/2013 | Ponnekanti et al. | |
| 2013/0213299 | A1* | 8/2013 | Hu et al. | 118/712 |

FOREIGN PATENT DOCUMENTS

| | | |
|---|---|---|
| TW | I288184 | 10/2007 |
| TW | I336733 | 2/2011 |
| TW | 201230428 | 7/2012 |
| TW | 201250017 | 12/2012 |
| WO | 2006123870 | 11/2006 |
| WO | 2012075017 | 6/2012 |

OTHER PUBLICATIONS

Gu and Zhong, "Discussion regarding depositing Ru thin film on PEALD platform by ALD process," Yuehyin Monthly, Mar. 2009, pp. 1-6.

Gao et al., "Research Progress of Thin Film Encapsulation of Organic Light-Emitting Devices," Chinese Journal of Liquid Crystals and Displays, Apr. 2012, pp. 198-203, vol. 27, No. 2.

Zheng et al., "Atomic Layer Deposition Equipments for the Encapsulation of Organic Electronics," Journal of the Mechatronic Industry, May 2012, pp. 91-92, No. 350.

Carcia et al., "Gas diffusion ultrabarriers on polymer substrates using Al2O3 atomic layer deposition and SiN plasma-enhanced chemical vapor deposition," Journal of Applied Physics, Jul. 29, 2009, pp. 023533, No. 106.

Chang et al., "Enhanced OLED performance upon photolithographic patterning by using an atomic-layer-deposited buffer layer," Organic Electronics, May 7, 2008, pp. 667-672, No. 9.

"Office Action of Taiwan Counterpart Application," issued on Feb. 4, 2015, p. 1-4.

* cited by examiner

MULTI-MODE THIN FILM DEPOSITION APPARATUS AND METHOD OF DEPOSITING A THIN FILM

CROSS-REFERENCE TO RELATED APPLICATION

This application claims the priority benefit of Taiwan application serial no. 102143232, filed on Nov. 27, 2013. The entirety of the above-mentioned patent application is hereby incorporated by reference herein and made a part of this specification.

TECHNICAL FIELD

The disclosure relates to a multi-mode thin film deposition apparatus and a method of depositing a thin film.

BACKGROUND

Organic semiconductor material and low power function electrode of an organic light-emitting diode (OLED) are degraded easily by oxygen and mist. In the process of commercialization of OLED, there are always challenges to increase the stability and the useful time of the elements of OLED by effective packaging technology. The conventional packaging method can not meet the requirement cause of the high cost and without flexibility. It becomes a trend to use atomic layer deposition (ALD) or plasma-enhanced chemical vapor deposition (PECVD) technology to produce a flexible barrier film.

The rate of ALD process depositing high compactness and low defect inorganic thin film such as aluminum oxide ($Al_2O_3$) is slow. It may take 200~300 minutes to reach the required packaging thickness about 2030 nm of an OLED by the ALD process. Without decreasing the cost effectively, the adoption in the market is low. Although the deposition rate of PECVD process is faster, plasma induced damage may occur in the elements of an OLED easily. With the combination of the advantages of these two deposition processes, dozens of atomic layers are deposited about 20 minutes by the ALD process to form a non-defect thin film (i.e. aluminum oxide layer) with the thickness about 2 nm, and a thicker Silicon Nitride (SiNx) layer is deposited by the PECVD process to against the aluminum oxide layer from hydrolysis in the air. Because of the non-defect thin film produced by the ALD process is compact, the non-defect thin film may protect the elements of the OLED from the influence of plasma induced damage during the PECVD process. It may substantially decrease the process time from 4-5 hours to 0.5 hour forming the barrier film.

However, in recent technology, the deposition steps during the ALD and the PECVD process are performed in two different chambers individually. It does not only increase the costs, but also expose the elements of the unfinished packaging OLED in the environment during the transfer process and cause low quality of the barrier film. Besides, the ALD process is entirely different from the PECVD process. The PECVD process must uniform the mix process gas via a showerhead, and produce plasma to ionize the process gas as a coating precursor reactant. For the reason, the showerhead is designed having 1~3 layers of gas diffusion space as buffer regions, so as to carry out the purpose of outputting gas uniformly. However, the ALD process emphasizes how to make the coating precursor reactant distribute and adhere on the substrate saturantly in the lowest cycle time. Hence, if the ALD process is performed via the showerhead of the PECVD process, for the purpose of saturate distribution, the process gas have to be filled in the showerhead and the entire chamber. Thus, the cycle time and the gas volume of use will increase.

SUMMARY

An exemplary embodiment of the disclosure provides a multi-mode thin film deposition apparatus including a reaction chamber, a carrying seat, a showerhead, an inert gas supplying source, a first gas inflow system and a second gas inflow system. The reaction chamber has a first opening and a second opening which penetrate through the reaction chamber and have the same axial direction. The carrying seat is disposed in the reaction chamber and suitable to carry a substrate. The showerhead has a gas mixing room and a plurality of gas holes. The plurality of gas holes is disposed at a side of the reaction chamber and faces to the carrying seat. The gas mixing room is connected to the reaction chamber through the plurality of gas holes. The first gas inflow system is connected to the first opening and suitable to supply a first process gas during a first thin film deposition process mode. The inert gas supplying source is connected to the gas mixing room of the showerhead and suitable to supply an inert gas which is non-reactive to the first process gas. The second gas inflow system is connected to the gas mixing room of the showerhead and suitable to supply a second process gas during a second thin film deposition process mode.

An exemplary embodiment of the disclosure also provides a method of depositing a thin film by using the foregoing multi-mode thin film deposition apparatus. The method includes providing a substrate and deposing the substrate on the carrying seat. Then, the first thin film deposition process mode is performed. During the first thin film deposition process, the first gas inflow system and the inert gas supplying source are opened synchronously. The first process gas is supplied by the first gas inflow system through the first opening to the reaction chamber, and an inert gas enters the reaction chamber via the plurality of gas holes of the showerhead at the same time. By controlling the inflow of the inert gas, the pressure of the gas mixing room and the gas holes is higher than the pressure of the reaction chamber. The inert gas outputting from the showerhead makes the first process gas attach to the substrate and forms a first thin film on the substrate. After that, the first gas inflow system and the inert gas supplying source are closed. Then, the second thin film deposition process mode is performed. During the second thin film deposition process, the second gas inflow system is opened. The second process gas enters the reaction chamber through the plurality of gas holes of the showerhead and forms a second thin film on the substrate.

An exemplary embodiment of the disclosure provides another method of depositing a thin film including providing a substrate which is disposed in a reaction chamber. Then, an ALD process mode is performed and a first process gas including at least two different precursor reactant gases is supplied. The at least two precursor reactant gases enter the reaction chamber through a first opening, respectively. When the at least two precursor reactant gases enter the reaction chamber, an inert gas is supplied by a showerhead at the same time. The inert gas outputting by the showerhead makes the first process gas attach to the substrate and forms a first thin film on the substrate. Subsequently, a PECVD process mode is performed and a second process gas is performed through the showerhead to form a second thin film on the substrate. In addition, the ALD process and the PECVD process are performed in the same reaction chamber.

In order to make the aforementioned and other features of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

The disclosure provides a multi-mode thin film deposition apparatus which is suitable to perform various modes of thin film deposition process on a substrate in a single chamber.

Figure 1:
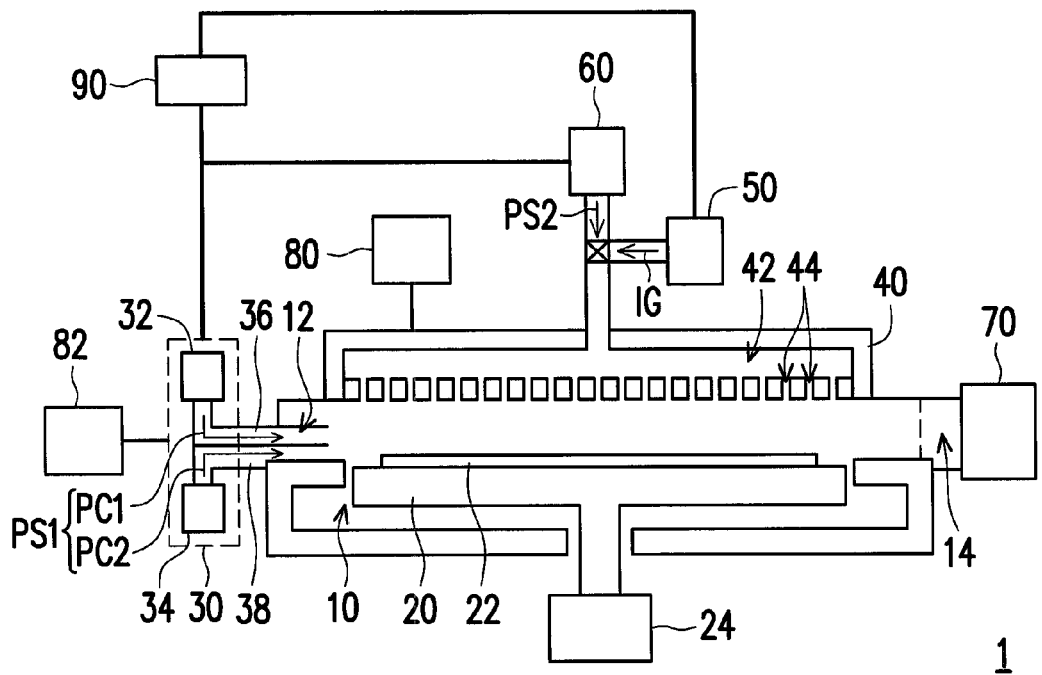
FIG. 1 is a structural schematic diagram of a multi-mode thin film deposition apparatus according to an embodiment of the disclosure.

FIG. 1 is a structural schematic diagram of a multi-mode thin film deposition apparatus according to an embodiment of the disclosure. Referring to FIG. 1, the multi-mode thin film deposition apparatus 1 includes a reaction chamber 10, a carrying seat 20, a first gas inflow system 30, a showerhead 40, an inert gas supplying source 50, and a second gas inflow system 60. The reaction chamber 10 has a first opening 12 and a second opening 14 which transversely penetrate through the reaction chamber 10 and have the same axial direction. The carrying seat 20 is disposed in the reaction chamber 10 and suitable to carry a substrate 22. In one embodiment of the disclosure, the multi-mode thin film deposition apparatus 1 further includes an elevating mechanism 24 connected to the carrying seat 20. The elevating mechanism 24 is suitable to adjust the position of the carrying seat 20. The first gas inflow system 30 is connected to the first opening 12 and is suitable to supply a first process gas PS1 during a first thin film deposition process mode. In addition, the disposed direction of the carrying seat 20 is parallel to the axial direction of the first opening 12 and the second opening 14 so that the first process gas PS1 enters from the first opening 12 and flows to the second opening 14 along the disposed direction of the carrying seat 20. The showerhead 40 has a gas mixing room 42 and a plurality of gas holes 44. The plurality of gas holes 44 is disposed at a side of the reaction chamber 40 and faces to the carrying seat 20. The gas mixing room 42 is connected to the reaction chamber 40 through the plurality of gas holes 44. The inert gas supplying source 50 is connected to the gas mixing room 42 of the showerhead 40 and is suitable to supply an inert gas IG. Besides, the inert gas IG means a gas which is non-reactive to the first process gas PS1. In an embodiment of the disclosure, the inert gas IG is listed on Group VIIIA such as argon (Ar) of the periodic table, but it is not limited herein. The second gas inflow system 60 is connected to the gas mixing room 42 of the showerhead 40 and is suitable to supply a second process gas PS2 during a second thin film deposition process mode.

In the embodiment of the disclosure, the first gas inflow system 30 further includes an air-extracting system 70 connected to the second opening 14 of the reaction chamber 10. The gas-extracting system 70 may be a pump, but is not limited herein. The gas-extracting system 70 offers a function of gas-extracting during modes transforming or mode performing. The gas and the reactant produced during the processes in the reaction chamber 10 and the gas mixing room 42 are extracted by the gas-extracting system 70. This will prevent the multi-mode thin film deposition apparatus 1 from causing pollution.

In detail, the first gas inflow system 30 includes a first gas supplying source 32 and a second gas supplying source 34. The first gas supplying source 32 is connected to the first opening 12 of the reaction chamber 10 via a first gas supplying tube 36 and the second gas supplying source 34 is connected to the first opening 12 of the reaction chamber 10 via a second gas supplying tube 38. In one embodiment of the disclosure, the first thin film deposition process mode is an atomic layer deposition (ALD) process mode. In the first thin film deposition process mode, the first process gas PS1 includes a first precursor reactant gas PC1 and a second precursor reactant gas PC2 supplied from the first gas supplying source 32 and the second gas supplying source 34, respectively.

Besides, in another embodiment of the disclosure, the first thin film deposition process mode is a plasma-enhanced atomic layer deposition (PEALD) process mode. The multi-mode thin film deposition apparatus 1 further includes a second voltage supplying source 82 connected to the first gas inflow system 30. When performing the PEALD process, the first process gas PS1 is applied a bias voltage by the second voltage supplying source 82 and produces plasma. Further, the second voltage supplying source 82 applies the bias voltage to one of the first precursor reactant gas PC1 and the second precursor reactant gas PC2 of the first process gas PS1 and one of the precursor reactant gases (i.e. PC1 and PC2) produces single wafer plasma to form a thin film on the substrate 22.

On the other hand, the multi-mode thin film deposition apparatus 1 further includes a first voltage supplying source 80 connected to the showerhead 40. In the embodiment of the disclosure, the second thin film deposition process mode is a plasma-enhanced chemical vapor deposition (PECVD) process mode. During the PECVD process, the first voltage supplying source 80 supplies a bias voltage to the second process gas PS2 which enters from the second gas inflow system 60 to the showerhead 40 and produces the plasma.

In addition, the multi-mode thin film deposition apparatus 1 further includes a flow control unit 90 which is connected to the first gas inflow system 30, the second gas inflow system 60 and the inert gas supplying source 50, respectively. During the different thin film deposition process modes, the flow control unit 90 controls the flow of the first process gas PS1, the second process gas PS2 and the inert gas IG, respectively.

The operation of the multi-mode thin film deposition apparatus during different thin film deposition process modes are describe below by referring FIG. 2 and FIG. 3.

Figure 2:
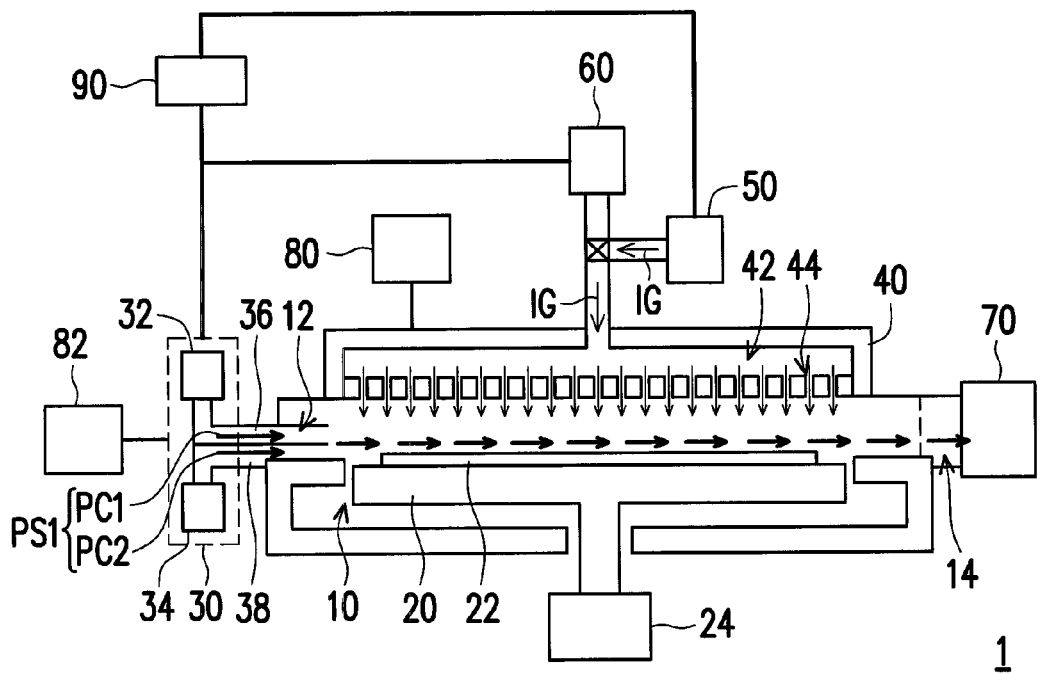
FIG. 2 is a schematic diagram of the flow of a process gas when the multi-mode thin film deposition apparatus performs a first thin film deposition process mode according to an embodiment of the disclosure.

FIG. 2 is a schematic diagram of the flow of a process gas when the multi-mode thin film deposition apparatus performs a first thin film deposition process mode according to an embodiment of the disclosure. Please refer to FIG. 2, the substrate 22 is provided which is disposed on the carrying seat 20 in the reaction chamber 10 at first. Then, the first thin film deposition process mode is performed. During the first thin film deposition process, the first gas inflow system 30 and the inert gas supplying source 50 are opened synchronously. The first process gas PS1 is supplied by the first gas inflow system 30 through the first opening 12 to the reaction chamber 10, and an inert gas IG enters the reaction chamber 10 via the plurality of gas holes 44 of the showerhead 40 at the same time. At this time, the inflow of the inert gas IG flows from the inert gas supplying source 50 via the adjustment of the flow control unit 90, so that the pressure of the gas mixing room 42 of the showerhead 40 and the plurality of gas holes 44 is higher than the pressure of the reaction chamber 10. In detail, when the first process gas PS1 enters to the reaction chamber 10 through the first opening 12 and outflows the second opening 14 along the flow direction, the reaction chamber 10 and the gas mixing room 42 should be filled with the first process gas PS1 at first. Because of the inert gas IG spouting out from the showerhead 40, the difference of the pressure leads the first process gas PS1 unable to enter the gas mixing room 42 through the plurality of gas holes 44. Thus, deposition of the first process gas PS1 on the plurality of gas holes 44 will be avoided so as to prevent the gas holes 44 from being blocked. Furthermore, without filling with the inert gas IG in the gas mixing room 42 of the showerhead 40 and the plurality of gas holes 44, when performing the first thin film deposition process, the first process gas PS1 is essential to fill with the entire reaction chamber 10, the gas mixing room 42 of the showerhead 40, and the plurality of gas holes 44. This may lead to unnecessary waste of the first process gas PS1. In detail, because the inert gas IG non-reactive to the first process gas PS1 enters the reaction chamber 10, the first process gas PS1 in the reaction chamber 10 flows to the second opening 14 along a direction as shown in FIG. 2. In this embodiment of the disclosure, the axial direction of the first opening 12 and the second opening 14 are the same, and the first opening 12 and the second opening 14 transversely penetrate through the reaction chamber 10. The plurality of gas holes 44 faces the carrying seat 20. Thus, the configuration relationships leads the first process gas PS1 attached to the substrate 22 via the inert gas IG outputted from the showerhead 40 during the process that the first process gas PS1 enters from the first opening 12 and flows to the second opening 14.

In the embodiment of the disclosure, the first thin film deposition process mode is an ALD process mode. The first process gas PS1 includes at least two different precursor reactant gases such as the first precursor reactant gas PC1 and the second precursor reactant gas PC2 that are mentioned before. The first precursor reactant gas PC1 and the second precursor reactant gas PC2 are supplied from the first gas supplying source 32 and the second gas supplying source 34, respectively, and enter the reaction chamber 10 at time intervals through the first opening 12. In detail, during the ALD process mode, the first precursor reactant gas PC1 enters the reaction chamber 10 at first, and the showerhead 40 offers the inert gas IG at the same time. The flow control unit 90 controls the flow of the first precursor reactant gas PC1 and the inert gas IG so as to lead the pressure of the gas mixing room 42 higher than the pressure of the reaction chamber 10. In one embodiment, the ratio of the flow rate of the first precursor reactant gas PC1 to the flow rate of the inert gas IG ranges of 2/3 to 5/4. However, the ratio of the flow rate of the first precursor reactant gas PC1 to the flow rate of the inert gas IG in the reaction chamber 10 is not limited herein. As long as the flow of the first precursor reactant gas PC1 and the inert gas IG are controlled by the flow control unit 90 and the first precursor reactant gas PC1 is leaded to reach saturated distribution on the substrate 22, the ALD process mode is performed. Then, the first precursor reactant gas PC1 and the inert gas IG are extracted by the gas-extracting system 70 through the second opening 14. After a time interval, the second precursor reactant gas PC2 is input and the inert gas IG is injected at the same time. The process is the same with the first precursor reactant gas PC1, it repeated no more herein. When the second precursor reactant gas PC2 reaches the substrate 22, a first thin film is produced after the reaction. The first gas inflow system 30 and the inert gas supplying source 50 are then closed to finish the ALD process mode. In one embodiment of the disclosure, the gas-extracting system 70 is opened to adjust the pressure of the reaction chamber 10 during all the ALD process mode.

Figure 3:
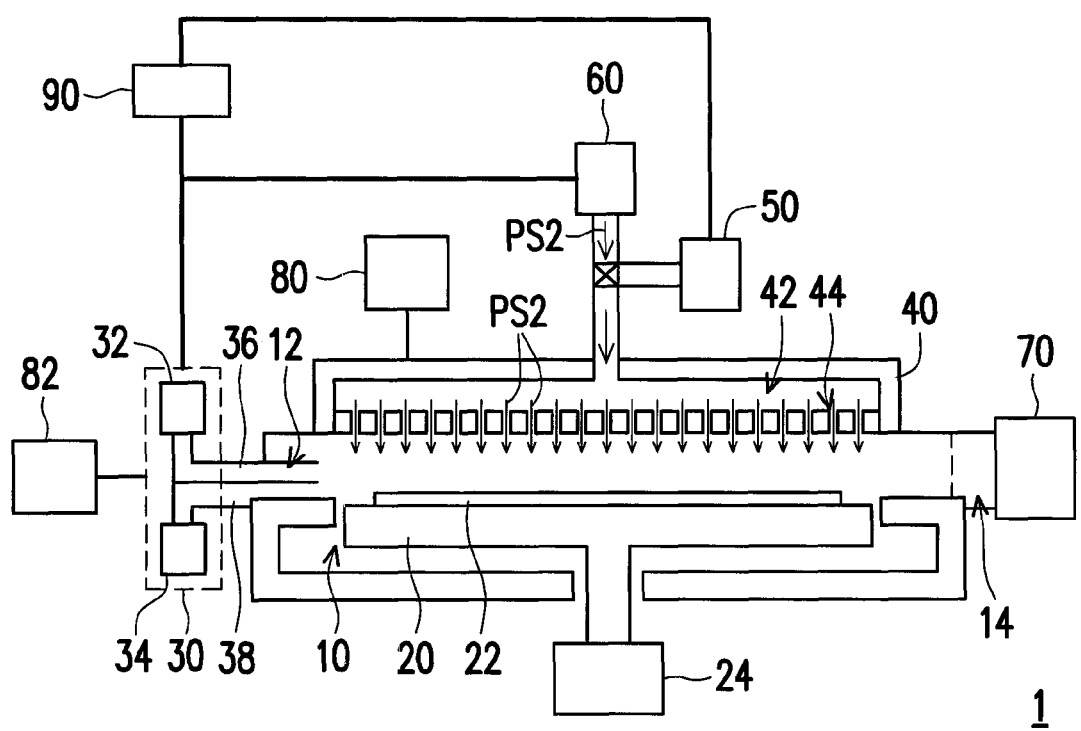
FIG. 3 is a schematic diagram of the flow of a process gas when the multi-mode thin film deposition apparatus performs a second thin film deposition process mode according to an embodiment of the disclosure.

FIG. 3 is a schematic diagram of the flow of a process gas when the multi-mode thin film deposition apparatus performs a second thin film deposition process mode according to an embodiment of the disclosure. Please refer to FIG. 3, when performing the second thin film deposition process mode, the second gas inflow system 60 is opened and the second process gas PS2 enters the gas mixing room 42 of the showerhead 40. After mixing amply in the gas mixing room 42, the second process gas PS2 enters the reaction chamber 10 through the plurality of gas holes 44. In the embodiment of the disclosure, the second thin film deposition process mode is a plasma-enhanced chemical vapor deposition (PECVD) process mode. When the second process gas PS2 supplied by the showerhead 40 enters the reaction chamber 10, the first voltage supplying source 80 is turned on and offers a radio frequency bias voltage to the second process gas PS2. Plasma is produced and then a second thin film is formed on the substrate 22.

In addition, during the first thin film deposition process mode, because the inert gas IG is injected into the reaction chamber 10, the first thin film deposition process mode is performed with less first process gas PS1. Besides, the injection of the inert gas IG may also prevent the plurality of gas holes 44 of the showerhead 40 from being blocked by the first process gas PS1 and maintain the quality of the operation during the second thin film deposition process mode. Thus, the first thin film deposition process mode (ALD process mode) and the second thin film deposition process mode (PECVD process mode) will be performed in the same reaction chamber.

Furthermore, during the ALD process mode, the first voltage supplying source 80 is turned off. However, when the multi-mode thin film deposition apparatus 1 further includes a second voltage supplying source 82 connected to the first gas inflow system 30, a plasma-enhanced atomic layer deposition (PEALD) process will also be performed. During the PEALD process, the second voltage supplying source 82 is turned on and one of the first precursor reactant gas PC1 and the second precursor reactant gas PC2 forms a single wafer plasma. Then, a third thin film is formed on the substrate 22.

In summary, in the embodiments of the disclosure, during the first thin film deposition process mode, by controlling the flow rate of the first process gas and the inert gas in the reaction chamber, the first process gas is reacted and deposited on the substrate. Besides, because of the injection of the inert gas during the first thin film deposition process mode, it will prevent the plurality of gas holes from being blocked. Furthermore, it will also be prevented that the entire showerhead and the gas chamber are filled with the first process and the waste of the first process gas is thus prevented. For this reason, in the embodiments of the disclosure, by using the multi-mode thin film deposition apparatus, the multi-mode thin film deposition processes will be performed in the same reaction chamber without transferring the substrate to different reaction chamber during different mode thin film deposition processes. It may save the consumed time of the transferring process of the substrate.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A multi-mode thin film deposition apparatus, comprising:
    a reaction chamber, having a first opening and a second opening penetrating through the reaction chamber, the first opening and the second opening having a same axial direction;
    a carrying seat, disposed in the reaction chamber and suitable to carry a substrate;
    a first gas inflow system, connected to the first opening and suitable to supply a first process gas during a first thin film deposition process mode;
    a showerhead, having a gas mixing room and a plurality of gas holes, wherein the plurality of gas holes is disposed at a side of the reaction chamber and faces to the carrying seat, and the gas mixing room is connected to the reaction chamber through the plurality of gas holes;
    an inert gas supplying source, connected to the gas mixing room of the showerhead and suitable to supply an inert gas which is non-reactive to the first process gas;
    a second gas inflow system, connected to the gas mixing room of the showerhead and suitable to supply a second process gas during a second thin film deposition process mode; and
    a first voltage supplying source connected to the showerhead and suitable to supply a radio frequency bias voltage to the second process gas so as to produce a plasma.

2. The multi-mode thin film deposition apparatus as claimed in claim 1, further comprising an elevating mechanism connected to the carrying seat and suitable to adjust the position of the carrying seat.

3. The multi-mode thin film deposition apparatus as claimed in claim 1, further comprising an air-extracting system connected to the second opening of the reaction chamber.

4. The multi-mode thin film deposition apparatus as claimed in claim 1, further comprising a second voltage supplying source connected to the first gas inflow system and suitable to supply a bias voltage to the first process gas so as to produce a plasma.

5. The multi-mode thin film deposition apparatus as claimed in claim 1, wherein the first gas inflow system further comprises a first gas supplying source and a second gas supplying source, the first gas supplying source is connected to the first opening of the reaction chamber via a first gas supplying tube and the second gas supplying source is connected to the first opening of the reaction chamber via a second gas supplying tube.

6. The multi-mode thin film deposition apparatus as claimed in claim 5, wherein the first thin film deposition process mode is an atomic layer deposition (ALD) process mode, and the first process gas comprises a first precursor reactant gas and a second precursor reactant gas supplied from the first gas supplying source and the second gas supplying source, respectively.

7. The multi-mode thin film deposition apparatus as claimed in claim 1, wherein the second thin film deposition process mode is a plasma-enhanced chemical vapor deposition (PECVD) process mode.

8. The multi-mode thin film deposition apparatus as claimed in claim 1, further comprising a flow control unit connected to the first gas inflow system, the second gas inflow system and the inert gas supplying source, respectively, and controlling flow of the first process gas, the second process gas and the inert gas, respectively.

9. A method of depositing a thin film by using a multi-mode thin film deposition apparatus, the method of depositing the thin film comprising:
    providing a substrate and deposing the substrate on a carrying seat;
    performing a first thin film deposition process mode, including:
        opening a first gas inflow system and an inert gas supplying source synchronously, a first process gas being supplied by the first gas inflow system through a first opening to a reaction chamber, and an inert gas entering the reaction chamber via a plurality of gas holes of a showerhead at the same time;
        controlling an inflow of the inert gas to make a pressure of the gas mixing room and the gas holes higher than the pressure of the reaction chamber, the inert gas outputted from the showerhead making the first process gas attached to the substrate and forming a first thin film on the substrate; and
        closing the first gas inflow system and the inert gas supplying source; and
    performing a second thin film deposition process mode, a second process gas entering the reaction chamber through the plurality of gas holes of the showerhead and forming a second thin film on the substrate;
    wherein the multi-mode thin film deposition apparatus comprises:
        the reaction chamber, having the first opening and a second opening penetrating through the reaction chamber, the first opening and the second opening having a same axial direction;
        the carrying seat, disposed in the reaction chamber and suitable to carry the substrate;
        the first gas inflow system, connected to the first opening and suitable to supply the first process gas during the first thin film deposition process mode;
        the showerhead, having a gas mixing room and the plurality of gas holes, wherein the plurality of gas holes is disposed at a side of the reaction chamber and faces to the carrying seat, and the gas mixing room is connected to the reaction chamber through the plurality of gas holes;
        the inert gas supplying source, connected to the gas mixing room of the showerhead and suitable to supply the inert gas which is non-reactive to the first process gas; and
        a second gas inflow system, connected to the gas mixing room of the showerhead and suitable to supply the second process gas during the second thin film deposition process mode;
    wherein the first process gas comprises a first precursor reactant gas and a second precursor reactant gas entering to the reaction chamber at time intervals.

10. The method of depositing the thin film as claimed in claim 9, wherein the ratio of the flow rate of the first precursor reactant gas to the flow rate of the inert gas ranges of 2/3 to 5/4.

11. A method of depositing a thin film, comprising:
    providing a substrate and deposing the substrate in a reaction chamber;

performing an atomic layer deposition (ALD) process mode, including:
supplying a first process gas, the first process gas comprising a first precursor reactant gas and a second precursor reactant gas, the first precursor reactant gas and the second precursor reactant gas entering the reaction chamber through a first opening respectively; and
supplying an inert gas simultaneously when the at least two precursor reactant gases enter the reaction chamber, wherein the inert gas outputted by the showerhead makes the first process gas attach to the substrate and forms a first thin film on the substrate; and
performing a plasma-enhanced chemical vapor deposition (PECVD) process mode, including:
supplying a second process gas from the showerhead to form a second thin film on the substrate;
wherein the ALD process mode and the PECVD process are performed in the same reaction chamber;
wherein the first precursor reactant gas and the second precursor reactant gas enter to the reaction chamber at time intervals;
wherein the first precursor reactant gas and the second precursor reactant gas enter to the reaction chamber at time intervals by a gas-extracting system extracting a gas, and the gas-extracting system is connected to a second opening of the reaction chamber.

12. The method of depositing the thin film as claimed in claim 11, wherein the ratio of the flow rate of the first precursor reactant gas to the flow rate of the inert gas in the reaction chamber ranges of 2/3 to 5/4.

13. The method of depositing the thin film as claimed in claim 11, wherein the showerhead comprises a gas mixing room and the method of performing the ALD process mode further comprises: controlling an inflow of the inert gas to make a pressure of the gas mixing room higher than the pressure of the reaction chamber.

14. The method of depositing the thin film as claimed in claim 11, wherein when performing the PECVD process mode, a first voltage supplying source connected to the showerhead is turned on.

15. The method of depositing the thin film as claimed in claim 14, wherein when performing the ALD process mode, the first voltage supplying source is turned off.

16. The method of depositing the thin film as claimed in claim 11, wherein when performing the ALD process mode, the second voltage supplying source is turned on, the second voltage supplying source is connected to a first gas inflow system which supplies the first process gas, and one of the first precursor reactant gas and the second precursor reactant gas forms a single wafer plasma and forms a third thin film on the substrate to perform a plasma-enhanced atomic layer deposition (PEALD) process.

17. The method of depositing the thin film as claimed in claim 11, wherein flow of the first process gas, the second process gas, and the inert gas are controlled by a flow control unit.

* * * * *